United States Patent
Ohiwa et al.

(10) Patent No.: US 6,846,750 B1
(45) Date of Patent: Jan. 25, 2005

(54) HIGH PRECISION PATTERN FORMING METHOD OF MANUFACTURING A SEMICONDUCTOR DEVICE

(75) Inventors: Tokuhisa Ohiwa, Kawasaki (JP); Shoji Seta, Yokohama (JP); Nobuo Hayasaka, Yokosuka (JP); Katsuya Okumura, Yokohama (JP); Akihiro Kojima, Yokohama (JP); Junko Ohuchi, Yokohama (JP); Tsukasa Azuma, Tokyo (JP); Hideo Ichinose, Yokohama (JP); Ichiro Mizushima, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 115 days.

(21) Appl. No.: 09/604,724

(22) Filed: Jun. 28, 2000

(30) Foreign Application Priority Data

Jun. 29, 1999 (JP) ............................................. 11-183908

(51) Int. Cl.⁷ ...................... H01L 21/302; H01L 21/461
(52) U.S. Cl. ...................... 438/739; 438/703; 438/704; 438/717; 438/736
(58) Field of Search ................................ 438/689, 703, 438/692, 694, 697, 699, 700, 701, 702, 704, 745, 750, 751, 756, 761, 763, 778, 787, 637, 638, 639, 640, 740, 970, 951, 636, 947, 952; 216/57, 39, 40, 55, 83, 88, 95, 96, 99, 100, 107

(56) References Cited

U.S. PATENT DOCUMENTS

| | | | | | |
|---|---|---|---|---|---|
| 4,434,224 | A | * | 2/1984 | Yoshikawa et al. | 430/323 |
| 5,185,278 | A | * | 2/1993 | Barker | 438/577 |
| 5,650,041 | A | * | 7/1997 | Gotoh et al. | 438/618 |
| 5,976,769 | A | * | 11/1999 | Chapman | 430/316 |
| 6,251,774 | B1 | * | 6/2001 | Harada et al. | 438/637 |
| 6,279,585 | B1 | * | 8/2001 | Shiraki et al. | 134/1.3 |

FOREIGN PATENT DOCUMENTS

JP            6-5592          1/1994

\* cited by examiner

Primary Examiner—George Fourson
Assistant Examiner—Julio J. Maldonado
(74) Attorney, Agent, or Firm—Finnegan, Henderson, Farabow, Garrett & Dunner, L.L.P.

(57) ABSTRACT

According to the present invention, there is provided a method of manufacturing a semiconductor device, where a soluble thin film which is soluble in a dissolving liquid is used. According to the method of the present invention, when a soluble thin film is formed between a film to be processed which should be patterned and a mask pattern, it becomes possible to remove the mask pattern by lifting-off. On the other hand, when the thin film is used for a dummy layer for forming an air wiring structure, the dummy layer can be removed without performing ashing using oxygen plasma.

8 Claims, 5 Drawing Sheets

HIGH PRECISION PATTERN FORMING METHOD OF MANUFACTURING A SEMICONDUCTOR DEVICE

CROSS-REFERENCE TO RELATED APPLICATIONS

This application is based upon and claims the benefit of priority from the prior Japanese Patent Application No. 11-183908, filed Jun. 29, 1999, the entire contents of which are incorporated herein by reference.

BACKGROUND OF THE INVENTION

The present invention relates to a method of manufacturing a semiconductor device, and in particular to a method of manufacturing a semiconductor device, which has a pattern forming step.

Conventionally, in manufacturing semiconductor devices, the following pattern forming process is used in many cases. First, a resist is applied on a thin film such as a silicon oxide film formed on a silicon substrate to form a resist film. Next, the resist film is pattern-exposed and developed so that a resist pattern is formed. Furthermore, using the resist pattern as an etching mask, a thin film such as a silicon oxide film or a surface of the silicon substrate is etched. Thereafter, the resist film is removed by ashing.

By the way, in recent years, as the degree of integration of a device increases, a margin of dimension or the like tends to become narrow in the above pattern forming process. For this reason, in order to form a finer pattern with a high precision, a technique such as utilization of exposure light having a shorter wavelength, utilization of an antireflection film for reducing influence of reflected light from a substrate, and decreasing the thickness of a resist film has been utilized.

However, in order to achieve a pattern size of less than 0.2 $\mu$m, the thickness of a resist film must be thinned down to 0.2 $\mu$m or so. When the resist film is thin, of course, the thickness of the resist pattern is also made thin. Such a thin resist pattern is insufficient as a mask for etching, particularly, reactive ion etching (hereinafter, called RIE) for forming contact holes having a depth of 1 $\mu$m or more. Accordingly, in the above pattern forming process, it has been difficult to implement such a pattern forming with a high precision.

As an effective method for solving such a problem, the following method is known. First, a polysilicon film where a high etching selectivity can be achieved is formed on a silicon oxide film. Next, a resist pattern is formed on the polysilicon film. Then, using the resist pattern as a mask, the polysilicon film is etched so that a polysilicon pattern is formed. Furthermore, using the polysilicon pattern as a mask, the silicon oxide film is etched. In the above manner, a contact hole is formed in the silicon oxide film.

In the above-mentioned method, the resist pattern is utilized for patterning the polysilicon film, and the polysilicon pattern is utilized as a mask for patterning the silicon oxide film. Therefore, according to this method, it is possible to form a contact hole with a relatively high precision.

In this method, however, the polysilicon pattern which has been used as the mask is removed by etching. For this reason, according to the above method, there occurs a problem that a portion of the silicon substrate exposed at a bottom of the contact hole is also etched.

In the conventional pattern forming process, there are also problems other than the above.

For example, when an organic SOG (Spin On Glass) film is used as an inter-layer insulating film, $CF_4/O_2$ down flow ashing or $O_2$ plasma ashing is utilized in order to remove the resist pattern which has been used for the pattern forming. When the resist pattern is removed by such a method, a reaction between organic components contained in the organic SOG film and oxygen radical or the like occurs. As a result, there occurs a problem that the composition in the organic SOG film varies and the dielectric constant $\in$ of the organic SOG film becomes larger than that of a design value.

Also, as a structure where parasitic capacity between an upper wiring and a lower wiring can be reduced, an air wiring structure having no inter-layer insulating film has been proposed. The air wiring structure is formed by a damascene process using a carbon film as a dummy layer in which wiring material is embedded. That is, first, a lower wiring is embedded in an insulating layer on a semiconductor substrate. Next, a carbon film is formed on the lower wiring and the insulating film by sputtering method. Thereafter, an $SiO_2$ film is formed on the carbon film, and a resist pattern is formed on the $SiO_2$ film. Furthermore, using the resist pattern as a mask, a wiring groove is formed in the carbon film by RIE method. Next, a thin film made of wiring material is formed such that it is embedded in the groove for wiring. A portion of the thin film positioned outside the wiring groove is removed using a chemical-mechanical polishing (CMP) method, so that the upper wiring is formed. Then, the carbon film is removed by $O_2$ ashing step. Thus, the air wiring structure is formed.

In the above-mentioned method, oxygen radical is supplied to the carbon film through the $SiO_2$ film to cause reaction between the oxygen radical and the carbon, so that the carbon film is removed. Therefore, the rate at which the carbon film is removed is affected largely by the $SiO_2$ film. That is, in the conventional method, there is a problem that it takes much time to form the air wiring structure.

BRIEF SUMMARY OF THE INVENTION

An object of the present invention is to provide a method of manufacturing a semiconductor device, which has an improved pattern forming step.

Another object of the invention is to provide a method of manufacturing a semiconductor device, which can realize a high dimension precision.

Another object of the invention is to provide a method of manufacturing a semiconductor device having an excellent characteristic.

Another object of the invention is to provide a method of manufacturing a semiconductor device, which can realize a high throughput.

Still another object of the invention is to provide a method of manufacturing a semiconductor device, which prevents the underlayer of a film to be processed from being injured when a mask pattern is removed.

Still another object of the invention is to provide a method of manufacturing a semiconductor device where increase in dielectric constant occurring when a mask pattern is removed from an insulating film containing organic components is suppressed.

Still another object of the invention is to provide a method of manufacturing a semiconductor device which has an air wiring structure capable of realizing a high throughput.

According to the first aspect of the invention, there is provided a method of manufacturing a semiconductor device comprising the steps of forming a soluble thin film which is soluble in a dissolving liquid on a film to be processed which is formed on a semiconductor substrate, forming a mask layer on the soluble thin film, forming a resist pattern on the mask layer, etching the mask layer using the resist pattern as a mask to form a mask pattern, etching the soluble thin film and the film to be processed using the mask pattern as at least a portion of a mask, and dissolving the etched soluble thin film in the dissolving liquid, thereby lifting off the mask pattern from the film to be processed.

According to the second aspect of the invention, there is provided a method of manufacturing a semiconductor device comprising the steps of forming a soluble thin film which is soluble in a dissolving liquid on a film to be processed which is formed on a semiconductor substrate, forming a first mask pattern on the soluble thin film, forming a mask layer on the first mask pattern such that an exposed portion of the soluble thin film is covered with the mask layer, etching back the mask layer such that an upper face of the first mask pattern is exposed and the portion of the soluble thin film covering the exposed portion of the soluble thin film remains to form a second mask pattern, removing the first mask pattern, etching thesoluble thin film and the film to be processed using the second mask pattern as a mask, and dissolving the etched soluble thin film in the dissolving liquid, thereby lifting off the second mask pattern from the film to be processed.

According to the third aspect of the invention, there is provided a method of manufacturing a semiconductor device comprising the steps of forming a soluble thin film which is soluble in a dissolving liquid on a first insulating film which is formed on a semiconductor substrate, forming a resist pattern on the soluble thin film, etching the soluble thin film using the resist pattern as a mask to form a wiring groove, removing the resist pattern after the step of forming the wiring groove, forming wiring in the wiring groove in an embedding manner, forming a second insulating film on the wiring and the soluble thin film, forming a window portion in the second insulating film such that the soluble thin film is exposed at a bottom of the window portion, and dissolving the soluble thin film in the dissolving liquid to remove the soluble thin film.

According to the fourth aspect of the invention, there is provided a method of manufacturing a semiconductor device comprising the steps of forming an organosilicon compound film on a semiconductor substrate, forming a silicon oxide film on the organosilicon compound film, forming a resist pattern on the silicon oxide film, etching the organosilicon compound film and the silicon oxide film using the resist pattern as a mask, and dissolving the etched silicon oxide film in the dissolving liquid, thereby lifting off the resist pattern from the organosilicon compound film.

As mentioned above, in the present invention, a soluble thin film which is soluble in a dissolving liquid is formed between a semiconductor substrate and a thin film having a predetermined pattern. Such a thin film can easily be removed without adversely affecting other members.

Therefore, according to the first aspect, the mask pattern can be lifted off by dissolving the soluble thin film in the dissolving liquid. For this reason, unlike a case where a mask pattern formed of polysilicon is removed by etching, even when the semiconductor substrate is a silicon substrate, the mask pattern can be removed without damaging the substrate. Furthermore, according to the first aspect, since the resist pattern is utilized for patterning of the mask layer and the mask pattern obtained thereby is used as a mask for patterning the film to be processed, a patterning accuracy can be improved. That is, according to the first aspect, it becomes possible to form a pattern at a high accuracy without damaging the substrate, or fabricate a semiconductor device having an excellent characteristic.

Also, according to the second aspect, for example, the first mask pattern is formed using the resist pattern as a mask, and the second mask pattern which is a reversed pattern of the first mask pattern is used as a mask for patterning the film to be processed. Therefore, according to the second aspect, like the first aspect, it becomes possible to form a pattern at a high accuracy without damaging the substrate, or fabricate a semiconductor device having an excellent characteristic.

According to the third aspect, since removal of the mask pattern from the film to be processed, namely, removal of the resist pattern from the organosilicon compound film is performed by the lifting-off, it is unnecessary to use oxygen radical for removing the resist pattern. Therefore, increase in dielectric constant of the organosilicon compound film can be suppressed and an excellent characteristic can be realized.

Furthermore, according to the fourth aspect, the soluble thin film is used as a dummy layer for forming the air wiring structure. In this case, the dummy layer can be removed without performing ashing where oxygen plasma is used. Therefore, a high throughput can be achieved.

In the above-mentioned first to third aspects, it is preferable that the soluble thin film contains at least one compound selected from the group consisting of tungsten oxide, aluminum oxide, titanium oxide, and titanium nitride. Also, it is preferable that the dissolving liquid is either one of water or alkaline dissolving liquid.

In the above-mentioned first and second aspects, it is preferable that the mask layer contains metal such as Si, W, Al, Ni, Ca and the like, or metal compound such as aluminum oxide, nickel oxide, titanium oxide, calcium fluoride, and the like. The first and second aspects are preferably applied to formation of a contact hole in the film to be processed. Also, it is preferable in the first and second aspects that a resist film having a thickness of 0.3 $\mu$m or less is used for forming the resist pattern.

In the third aspect of the invention, the soluble thin film can be removed by causing the dissolving liquid to contact with the soluble thin film through the window portion. Also, in the third aspect, prior to the step of forming the soluble thin film, the lower wiring can be formed such that it is embedded in the first insulating film. In this case, after the step of forming the wiring groove and before the step of forming the lower layer wiring in the embedding manner, a via hole reaching the lower layer wiring is formed at the bottom of the wiring groove, and when the lower wiring is formed in the embedding manner, a plug electrode can be formed in the via hole.

In the fourth aspect of the invention, the silicon oxide film can be formed, for example, by supplying gas containing activated oxygen onto a surface of the organosilicon compound film. Also, in the fourth aspect, for example, diluted oxygen fluoride can be used as the dissolving liquid, and a SOG film can be used as the organosilicon compound film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The present invention will be described in detail with reference to the accompanying drawings. Incidentally, the same reference numerals denote the same or similar components in these drawings, and a duplicate explanation thereof will be omitted.

Figure 1A:
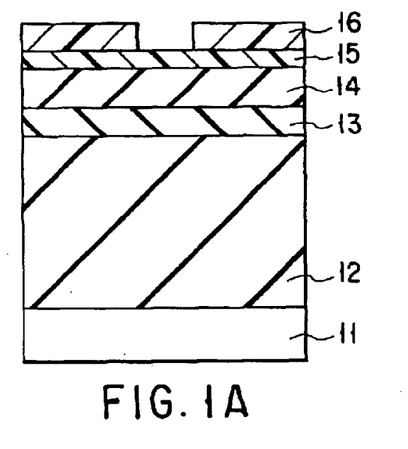
FIGS. 1A to 1E are sectional views schematically showing a method of manufacturing a semiconductor device according to the first embodiment of the present invention, respectively.
Figure 1B:
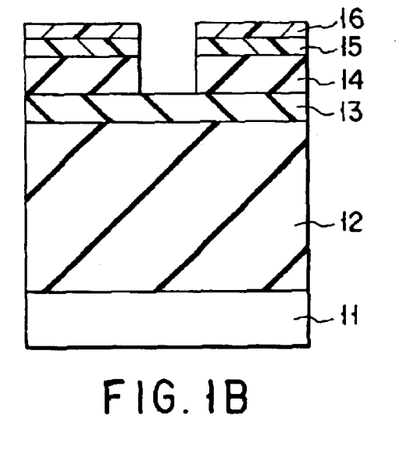
Figure 1C:
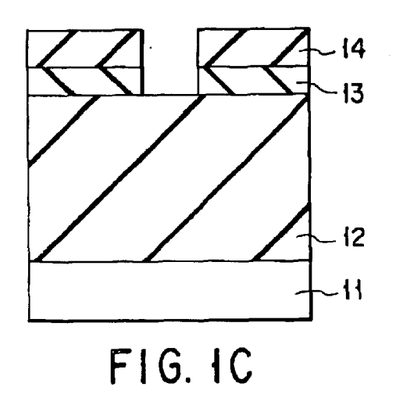
Figure 1D:
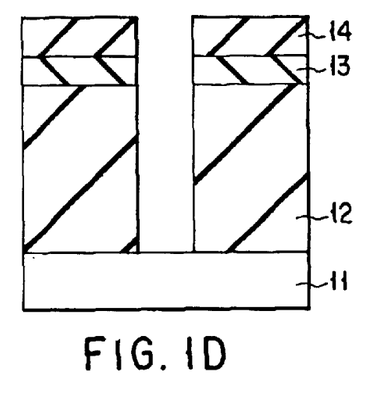
Figure 1E:
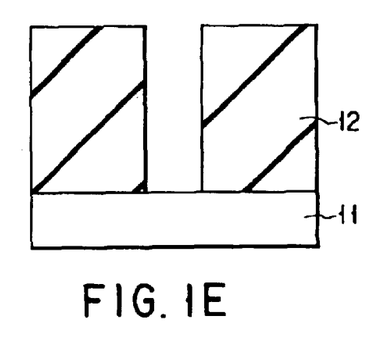

FIGS. 1A to 1E are sectional views schematically showing a method of manufacturing a semiconductor device according to the first embodiment of the present invention. As explained below, according to the first embodiment, a contact hole 19 shown in FIG. 1E is formed using a resist film having a thickness of 0.3 µm or less.

As shown in FIG. 1A, first, a silicon substrate 11, which has a silicon oxide film 12 with a thickness of 1 µm or more as a film to be processed on one main surface, is prepared. Next, predetermined coating solution is coated on the silicon oxide film 12, and the coating film thus obtained is baked so that a $WO_3$ film 13 with the thickness of 100 nm is formed as a soluble thin film. Thereafter, an $Al_2O_3$ film 14 is formed as a mask layer on the $WO_3$ film 13 by sputtering process. Furthermore, predetermined coating solution is coated on the $Al_2O_3$ film 14, and the coating film thus obtained is baked so that an organic antireflection film 15 with the thickness of 60 nm is formed. A resist film is formed on the organic antireflection film 15, and the resist film is patterned by lithography technique so that a resist pattern 16 whose thickness is 200 nm is formed.

Next, as shown in FIG. 1B, patterning of the organic antireflection film 15 by RIE using $O_2$ gas and patterning of the $Al_2O_3$ film 14 by RIE using $Cl_2/BCl_3$ mixed gas are performed sequentially. Incidentally, the film thickness of the $Al_2O_3$ film 14, namely, $Al_2O_3$ pattern 14, after these etchings have been completed was 50 nm.

Next, as shown in FIG. 1C, the $WO_3$ film 13 is etched by RIE method using $CF_4/Ar/O_2$ mixed gas so that a surface of the silicon oxide film 12 is partially exposed. Incidentally, with etching the $WO_3$ film 13, all of the resist pattern 16 and the organic antireflection film 15 are removed.

Then, as shown in FIG. 1D, the silicon oxide film 12 is etched by RIE method using $C_4F_8/CO/Ar/O_2$ mixed gas, and a surface of the silicon substrate 11 is partially exposed. The RIE selectivity of the $Al_2O_3$ pattern 14 to the silicon oxide film 12 is as high as 20 or more. Accordingly, even when the thickness of the $Al_2O_3$ pattern 14 is as thin as 100 nm or so, it is possible to form a contact hole with the depth of 1 µm in the silicon oxide film 12.

Furthermore, as shown in FIG. 1E, the substrate 11 is dipped in hot water of 60° C. so that the $WO_3$ film 13 is dissolved in the hot water. By dissolution of $WO_3$ film 13, the $Al_2O_3$ pattern 14 was lifted off from the silicon oxide film 12 having the contact hole. Also, in this embodiment, since polysilicon is not used as an etching mask for patterning the silicon oxide film 12, a surface of the silicon substrate 11 exposed at a bottom of the contact hole and the silicon oxide film 12 were hardly etched during the removal of the etching mask. Accordingly, a pattern with designed dimensions was obtained.

As described above, in this embodiment, the soluble thin film, the mask layer with a high RIE resistance, and the antireflection layer are interposed between the film to be processed and the resist film. That is, in this embodiment, a low light reflectivity from the substrate necessary to form a fine resist pattern at a high accuracy, a sufficient RIE resistance required for a RIE mask, and a high removability necessary for the RIE mask are respectively realized by distinct thin films. According to such a structure, even when the thickness of the resist film is as thin as 200 nm or so, it becomes possible to form a contact hole with the depth of 1 µm with a high precision.

Incidentally, in this embodiment, the hot water of 60° C. has been used as the dissolving liquid for dissolving the $WO_3$ film 13. However, hot water is not used as the dissolving liquid necessarily, and water with a ordinary temperature can be used as the same. Also, material constituting the mask layer 13 is not limited to $WO_3$. Besides tungsten oxide, soluble compound soluble in water or alkaline solution, such as aluminum oxide, titanium oxide, titanium nitride and the like can be used as the material for constituting the mask layer 13.

For example, the $Al_2O_3$ film dissolves in 0.08% TMAH (tetramethylammonium hydroxide) aqueous solution at an etching rate of 470 Å/min, while the Si film dissolves in 0.08% TMAH aqueous solution at an etching rate of several Å/min. That is, when these thin films are etched with TMAH aqueous solution, a sufficiently high etching selectivity can be achieved. Accordingly, $Al_2O_3$ or the like can be used as material constituting the mask layer 13.

Also, in the first embodiment, the mask layer 13 has been constituted with $WO_3$, but other materials can be used therefor. For example, the mask layer 13 can be constituted with material which can be etched by gas containing fluorine, namely material containing metal, metal oxide, metal fluoride, or the like generating fluoride whose vapor pressure is 5 to 10 Torr or less when etched with gas containing fluorine. As such materials,.for example, material containing metal such as Si, W, Al, Ni, Ti, Ca and the like; material containing metal oxide such as aluminum oxide, nickel oxide, titanium oxide and the like; and material containing metal fluoride such as calcium fluoride and the like can be listed up.

Furthermore, in the first embodiment, during the etching of the $WO_3$ film 13, all of the resist pattern 16 and the organic antireflection film 15 have been removed, but they are not removed completely during the etching of $WO_3$ film 13. When the resist pattern 16 and the organic antireflection film 15 remain, they may be removed prior to the etching of the silicon oxide film 12, or they may be used as a portion of an etching mask for the silicon oxide film 12 without removing them.

FIGS. 2A to 2G are sectional views schematically showing a fabrication process of a semiconductor device according to a second embodiment of the present invention. As explained below, according to the second embodiment, a pattern forming is performed by a process different from that explained in the first embodiment.

Figure 2A:
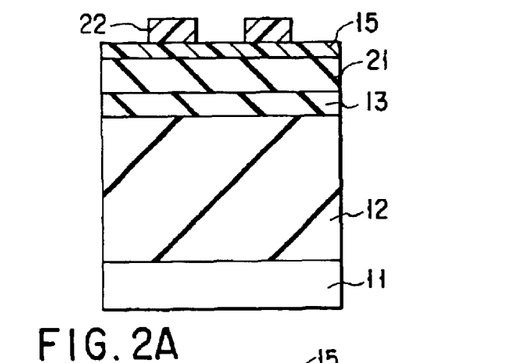
FIGS. 2A to 2G are sectional views schematically showing a method of manufacturing a semiconductor device according to the second embodiment of the present invention, respectively.

First, as shown in FIG. 2A, a silicon substrate 11, which has a silicon oxide film 12 with the thickness of 1 μm as a film to be processed on one main surface, is prepared. Next, predetermined coating solution is coated on the silicon oxide film 12, and by baking the coating film thus obtained, a $WO_3$ film 13 with the thickness of 100 nm is formed as a soluble thin film. Thereafter, SOG is applied on the $WO_3$ film 13, and a SOG film 21 with the thickness of 200 nm is formed by baking the applied SOG. Next, an organic antireflection film 15 is formed on the SOG film 21, and a resist pattern 22 whose thickness is 200 nm is formed on the organic antireflection film 15.

Figure 2B:
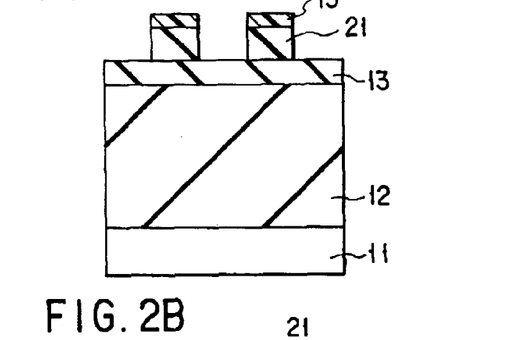

Next, as shown in FIG. 2B, the antireflection film 15 and the SOG film 21 are sequentially patterned by RIE method using the resist pattern 22 as a mask. Thereafter, the resist pattern 22 is removed by $O_2$ ashing. A first mask pattern is obtained by patterning the SOG film 21 in such a manner.

Figure 2C:
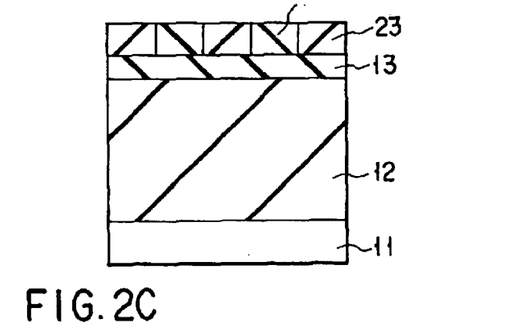

Next, as shown in FIG. 2C, predetermined coating solution is coated on the entire surface of the substrate 11 on which the SOG pattern 21 has been formed, and an $Al_2O_3$ film 23 is formed by baking the coating film. Incidentally, the $Al_2O_3$ film 23 is formed such that it fills opening portions of the SOG pattern 21. Then, the surface of the substrate 11 on which the $Al_2O_3$ film 23 has been formed is subjected to planarization by CMP such that an upper surface of the SOG pattern 21 is exposed. As a result, the $Al_2O_3$ film 23 is patterned and a reversed pattern constituted with $Al_2O_3$ is obtained as a second mask pattern.

Figure 2D:
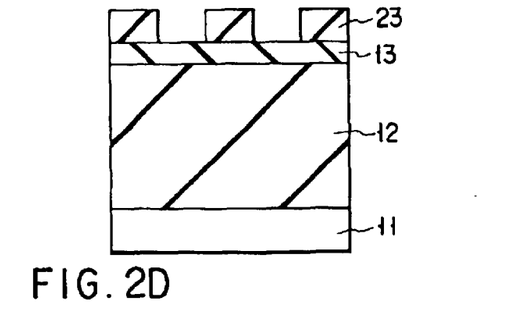

Next, as shown in FIG. 2D, the SOG pattern 21 is removed by a hydrofluoric acid treatment.

Figure 2E:
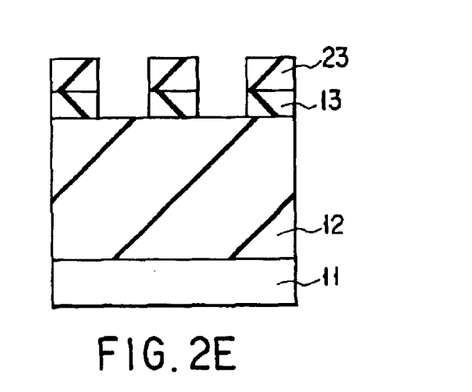

Furthermore, as shown in FIG. 2E, the $WO_3$ film 13 is etched by RIE method using $CF_4/Ar/O_2$ mixed gas, so that the surface of the silicon oxide film 12 is partially exposed.

Figure 2F:
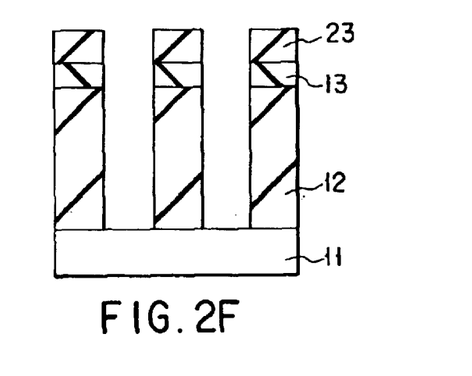

Thereafter, as shown in FIG. 2F, the silicon oxide film 12 is etched by RIE method using $C_4F_8/CO/Ar/O_2$ mixed gas, so that the surface of the silicon substrate 11 is partially exposed. A contact hole is formed in the silicon oxide film 12 in the above manner.

Figure 2G:
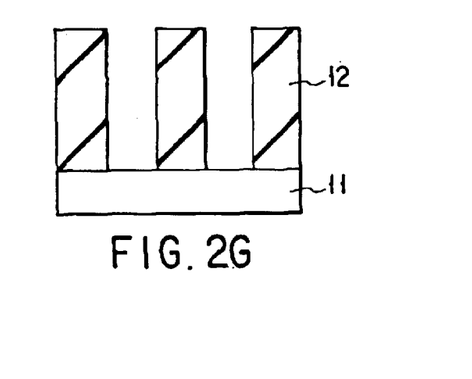

Furthermore, as shown in FIG. 2G, the substrate is dipped in hot water of 60° C. so that the $WO_3$ film 13 is dissolved in the hot water and the $Al_2O_3$ pattern 23 is lifted off.

In the second embodiment which has been explained above, the same effect as in the first embodiment can be obtained.

FIGS. 3A to 3F are sectional views schematically showing a method of manufacturing a semiconductor device according to a third embodiment of the present invention, respectively. As explained below, according to the third embodiment, a pattern forming is performed by a process similar to one which has been explained regarding the second embodiment.

Figure 3A:
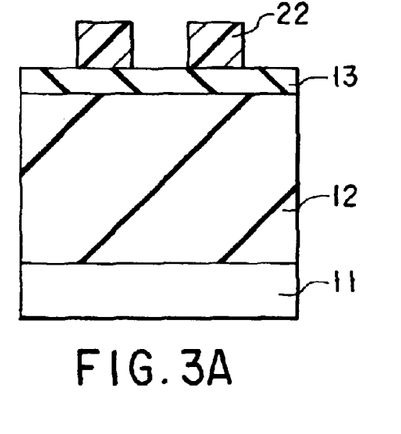
FIGS. 3A to 3F are sectional views schematically showing a method of manufacturing a semiconductor device according to the third embodiment of the present invention, respectively.

First, as shown in FIG. 3A, a silicon substrate 11, which has a silicon oxide film 12 with the thickness of 1 μm as a film to be processed on one main surface, is prepared. Next, predetermined coating solution is coated on the silicon oxide film 12, and a $WO_3$ film 13 with the thickness of 100 nm is formed as a soluble thin film by baking the coating film. Thereafter, a resist pattern 22 whose thickness is 200 nm is formed on the $WO_3$ film 13. In this aspect, the resist pattern 22 is used as a first mask pattern unlike the second aspect.

Figure 3B:
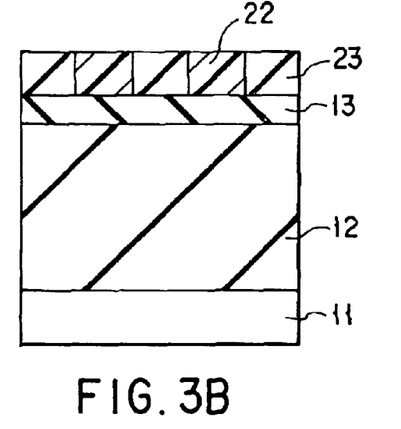

Next, as shown in FIG. 3B, predetermined coating solution is coated on the entire surface of the substrate 11 on which a resist pattern 22 has been formed, and an $Al_2O_3$ film 23 is formed by baking the coating film. Incidentally, the $Al_2O_3$ film 23 is formed such that it fills an opening portion of the resist pattern 22. Thereafter, the $Al_2O_3$ film 23 is etched back to expose an upper surface of the resist pattern 22. As a result, the $Al_2O_3$ film 23 is patterned and a reversed pattern constituted with $Al_2O_3$ is obtained as a second mask pattern.

Figure 3C:
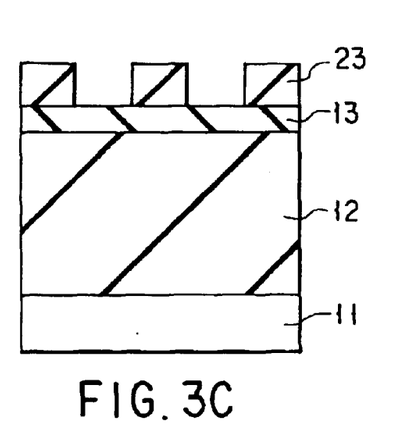

Next, as shown in FIG. 3C, the resist pattern 22 is removed by developing treatment.

Figure 3D:
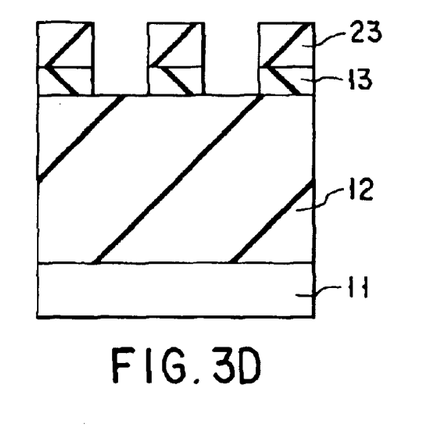

Furthermore, as shown in FIG. 3D, the $WO_3$ film 13 is etched by RIE method using $CF_4/Ar/O_2$ mixed gas, so that the surface of the silicon oxide film 12 is partially exposed.

Figure 3E:
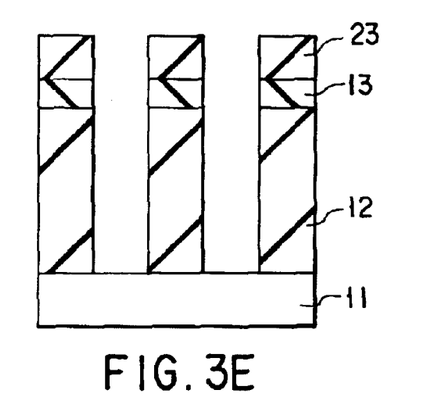

Then, as shown in FIG. 3E, the silicon oxide film 12 is etched by RIE method using $C_4F_8/CO/Ar/O_2$ mixed gas, so that the surface of the silicon substrate 11 is partially exposed. A contact hole is formed in the silicon oxide film 12 in the above manner.

Figure 3F:
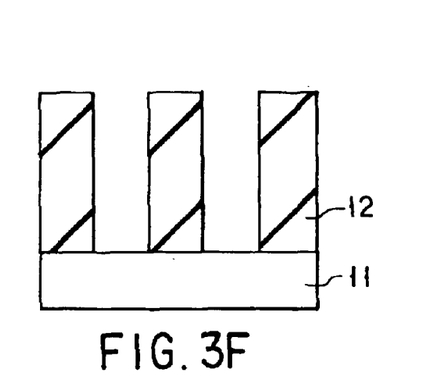

Furthermore, as shown in FIG. 3F, the substrate thus processed is dipped in hot water of 60° C. so that the $WO_3$ film 13 is dissolved in the hot water to lift off the $Al_2O_3$ pattern 23.

In the third embodiment explained above, the same effect as in the first and second embodiments can be obtained.

FIGS. 4A to 4E are sectional views schematically showing a fabrication process of a semiconductor device according to the fourth embodiment of the present invention, respectively. As explained below, according to a fourth embodiment, an organic SOG film is used as a film to be processed, and variation in the dielectric constant of an organic SOG film caused by removing a mask pattern is suppressed.

Figures 4A, 4D:
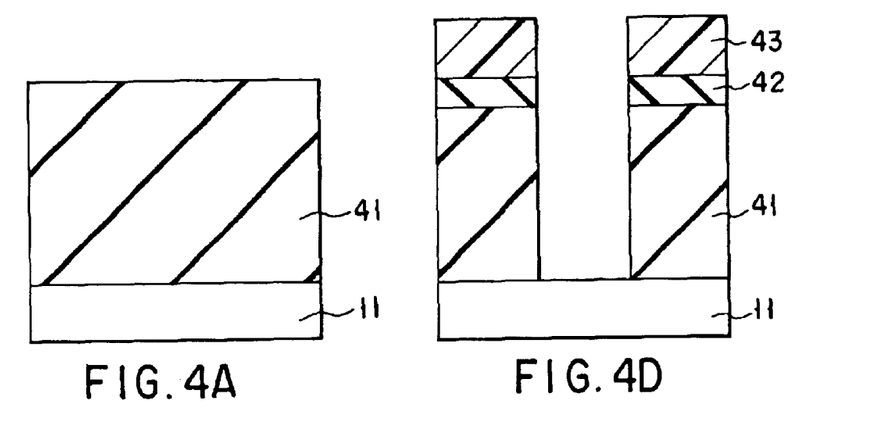
FIGS. 4A to 4E are sectional views schematically showing a method of manufacturing a semiconductor device according to the fourth embodiment of the present invention, respectively.

First, as shown in FIG. 4A, an organic SOG film 41 containing organic components in a predetermined concentration, for example, containing methylsiloxane in the concentration of 20 wt %, is formed on one main surface of a silicon substrate 11.

Figures 4B, 4E:
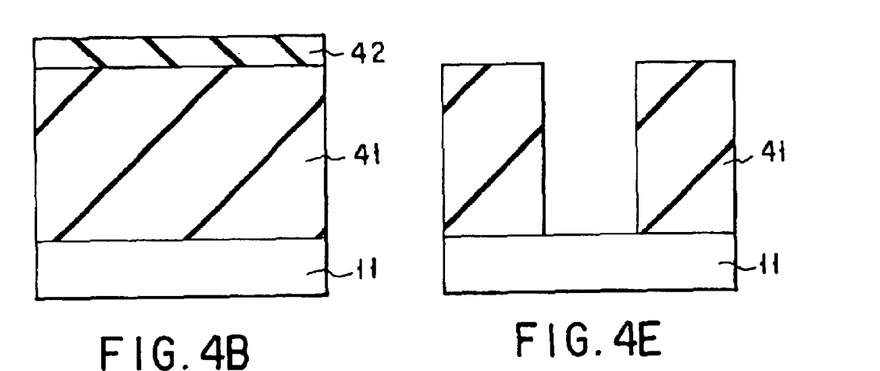

Next, as shown in FIG. 4B, the organic components are removed from the surface of the organic SOG film 41 by performing $O_2$ plasma processing to form a silicon oxide film 42 whose thickness is 40 nm.

Figure 4C:
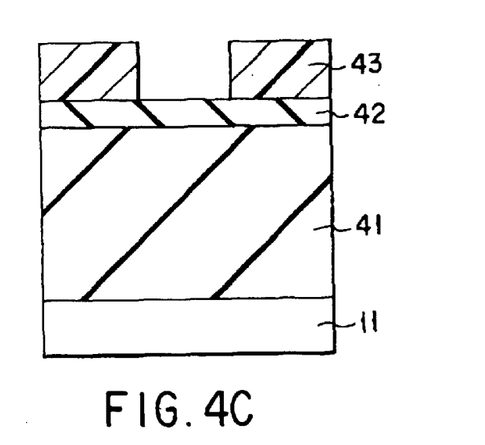

Next, as shown in FIG. 4C, a resist pattern 43 is formed on the silicon oxide film 42.

Furthermore, as shown in FIG. 4D, the silicon oxide film 42 and the organic SOG film 41 are etched using the resist pattern 43 as a mask by RIE method using $CF_4/CHF_3$ mixed gas.

Thereafter, as shown in FIG. 4E, the substrate is dipped in diluted hydrofluoric acid so that the silicon oxide film 42 is dissolved to lift off the resist pattern 43. At this time, the organic SOG film 41 was hardly etched by the hydrofluoric acid.

According to the fourth embodiment explained above, since $O_2$ ashing step is not used for removal of the resist pattern 43 but lift-off is used therefor, increase in dielectric constant ε due to composition change of the organic SOG film 41 can be prevented.

Incidentally, in this embodiment, the silicon film 42 has been formed by performing $O_2$ plasma processing on the surface of the organic SOG film 41, but it is possible to use other processings. For example, the silicon oxide film 42 can be formed by $CF_4/O_2$ down flow ashing or $O_3$ gas irradiation.

Also, in the fourth embodiment, the pattern forming has been performed on the organic SOG film 41, but the above process can be applied to organosilicon compounds formed by CVD method or the like.

FIGS. 5A to 5F are sectional views schematically showing a method of manufacturing a semiconductor device according to a fifth embodiment of the present invention. As explained below, according to the fifth embodiment, an air wiring structure is formed.

Figure 5A:
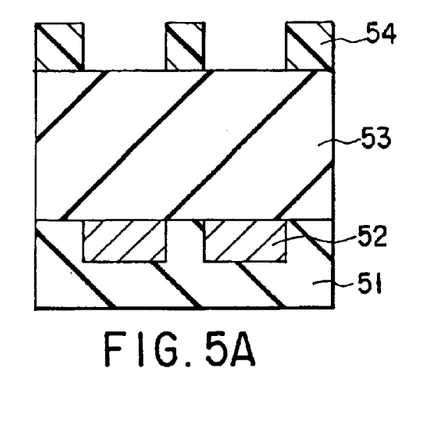
FIGS. 5A to 5F are sectional views schematically showing a method of manufacturing a semiconductor device according to the fifth embodiment of the present invention, respectively.

First, as shown in FIG. 5A, lower wiring 52 is formed in an insulating film 51 which is a first insulating film and which is formed on a semiconductor substrate (not shown). Next, a $WO_3$ film 53 whose thickness is 300 nm is formed as a soluble thin film on the insulating film 51 in which the lower wiring 52 has been formed. Thereafter, a resist pattern 54 is formed on the $WO_3$ film 53. Incidentally, the $WO_3$ film 53 is used as a dummy layer for forming an air wiring structure.

Figure 5B:
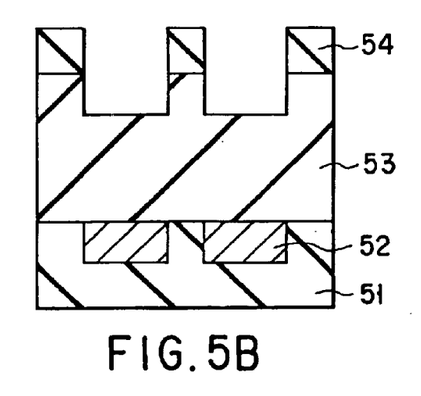

Next, as shown in FIG. 5B, the $WO_3$ film 53 is etched by RIE method using $CF_4/Ar/O_2$ mixed gas, so that wiring grooves for forming upper wiring in an embedding manner are formed.

Figure 5C:
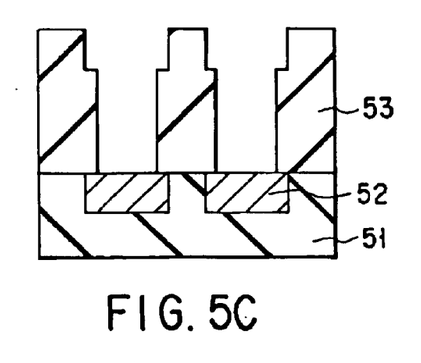

Next, as shown in FIG. 5C, the resist pattern 54 is removed by $O_2$ ashing. Then, a resist pattern (not shown) is formed on the $WO_3$ film 53. Furthermore, the $WO_3$ film 53 is etched using the resist pattern as a mask, so that via holes are formed at bottom portions of the wiring grooves in the $WO_3$ film 53. Incidentally, the resist pattern used for forming the via holes is removed by $O_2$ ashing.

Figure 5D:
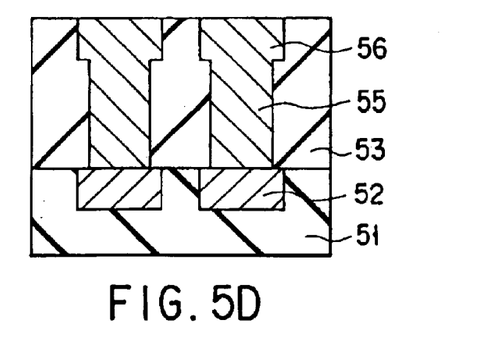

Next, as shown in FIG. 5D, plug electrodes 55 and upper wiring 56 are formed in the via holes and the wiring grooves in the $WO_3$ film 53 in an embedding manner. That is, an Al film is formed on the $WO_3$ film 53 by sputtering process such that it is embedded in the wiring grooves and the via holes of the $WO_3$ film 53, and thereafter, the surface of the Al film is planarized by CMP method to expose an upper surface of the $WO_3$ film 53.

Figure 5E:
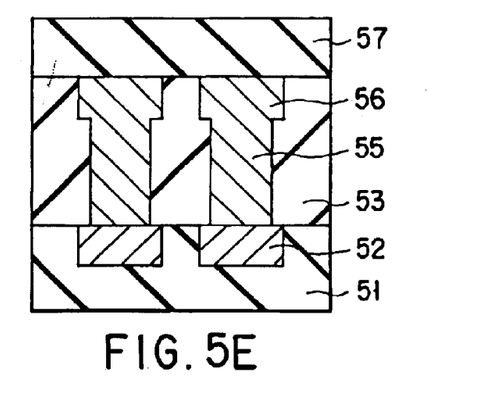

Next, as shown in FIG. 5E, a silicon oxide film 57 whose thickness is 200 nm is formed as a second insulating film on the $WO_3$ film 53 by plasma CVD method.

Figure 5F:
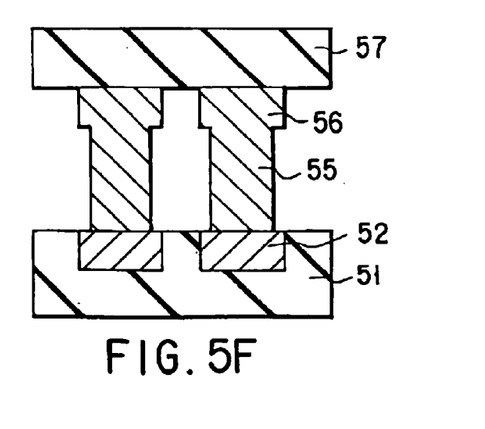

Furthermore, as shown in FIG. 5F, a window portion (not shown) is formed in the silicon oxide film 57 such that a portion of the surface of the $WO_3$ film 53 is exposed. The substrate is dipped in hot water of 60° C. so that the $WO_3$ film 53 is dissolved in the hot water. In the above manner, an air wiring structure is obtained.

According to this embodiment, since the $WO_3$ film 53 which is a soluble thin film is used as the dummy layer, wet etching can be utilized for removal of the dummy layer. That is, according to this embodiment, unlike a case where the dummy layer is constituted with carbon, it is unnecessary to use radical oxygen in order to remove the dummy layer and, therefore, the dummy layer can be removed in shorter time, namely the air wiring structure can be formed in shorter time.

As described above, according to the present invention, a soluble thin film which is soluble in dissolving liquid is formed between a semiconductor substrate and a thin film having a predetermined pattern. Such a thin film can be removed easily without adversely affecting other elements.

That is, by interposing this soluble thin film between a film to be processed and a mask pattern, the mask pattern can be removed by lifting-off and, therefore, the mask pattern can easily be removed without damaging an exposed portion of the substrate. Also, since it is unnecessary to use oxygen plasma or the like for removal of the mask pattern, even when the film to be processed contains organic components, the mask pattern can be removed without changing its composition. Furthermore, when the soluble thin film is used as the dummy layer for forming the air wiring structure, wet etching can be utilized for removal of the dummy layer.

Accordingly, when the resist pattern is utilized for patterning of the mask layer and the mask pattern thus obtained is used as a patterning mask for a film to be processed, it becomes possible to form a fine pattern at a high accuracy without damaging the substrate by interposing the soluble thin film between the film to be processed and the mask pattern.

Also, the second mask pattern which is a reversed pattern of the first mask pattern is used as a mask for patterning a film to be processed, and it becomes possible to form a fine pattern with a high precision without damaging the substrate by interposing the soluble thin film between the film to be processed and the second mask pattern.

Also, when the film to be processed is an organosilicon compound film, increase in dielectric constant of an organosilicon compound film produced when the mask pattern is removed can be suppressed by interposing a soluble thin film between the organosilicon compound film and the mask pattern.

Furthermore, when a soluble thin film has been used as a dummy layer for forming an air wiring structure, since wet etching can be utilized for removing the dummy layer, a high throughput can be achieved.

That is, according to the present invention, there is provided a fabrication process of a semiconductor device, which has a largely improved pattern forming step as compared with the conventional art.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:

forming a soluble thin film by distributing and baking a coating solution on a film to be processed which is formed on a semiconductor substrate, wherein the soluble thin film is soluble in a dissolving liquid;

forming a mask layer on the soluble thin film;

forming a resist pattern on the mask layer;

etching the mask layer using the resist pattern as a mask to form a mask pattern;

etching the soluble thin film and the film to be processed using the mask pattern as at least a portion of a mask; and dissolving the etched soluble thin film in the dissolving liquid, thereby lifting off the mask pattern from the film to be processed.

2. A method according to claim 1, wherein the soluble thin film contains at least one compound selected from the group consisting of tungsten oxide, aluminum oxide, titanium oxide, and titanium nitride.

3. A method according to claim 1, wherein the dissolving liquid is either water or alkaline solution.

4. A method according to claim 1, wherein the step of etching the soluble thin film and the film to be processed comprises forming a contact hole in the film to be processed.

5. A method according to claim 1, wherein the step of forming the resist pattern comprises forming a resist film with a thickness of 0.3 μm or more on the mask layer and patterning the resist film by photolithography technique to form the resist pattern.

6. A method of manufacturing a semiconductor device, comprising:

forming a soluble thin film by distributing and baking a coating solution on a film to be processed which is formed on a semiconductor substrate, wherein the soluble thin film is soluble in a dissolving liquid;

forming a mask layer on the soluble thin film;

forming an antireflection film on the mask layer;

forming a resist pattern on the antireflection film;

etching the antireflection film and the mask layer using the resist pattern as a mask to form a mask pattern;

etching the soluble thin film and the film to be processed using the mask pattern as at least a portion of a mask; and dissolving the etched soluble thin film in the dissolving liquid, thereby lifting off the mask pattern from the film to be processed.

7. A method according to claim 6, wherein the antireflection film is an organic antireflection film.

8. A method according to claim 1, further comprising the step of forming an antireflection film on the mask layer before the step of forming the resist pattern.

* * * * *

UNITED STATES PATENT AND TRADEMARK OFFICE
CERTIFICATE OF CORRECTION

PATENT NO. : 6,846,750 B1
DATED : January 25, 2005
INVENTOR(S) : Ohiwa et al.

It is certified that error appears in the above-identified patent and that said Letters Patent is hereby corrected as shown below:

Column 10,
Line 52, after "in a dissolving liquid" insert -- and contains an inorganic compound --.

Column 11,
Line 16, after "in a dissolving liquid" insert -- and contains an inorganic compound --.

Column 12,
Line 16, add the following claim,
-- 9. A method according to claim 6, wherein the soluble thin film contains at least one compound selected from the group consisting of tungsten oxide, aluminum oxide, titanium oxide and titanium nitride. --

Signed and Sealed this

Seventeenth Day of May, 2005

JON W. DUDAS
*Director of the United States Patent and Trademark Office*